(12) United States Patent
Bedell et al.

(10) Patent No.: US 10,249,737 B2
(45) Date of Patent: Apr. 2, 2019

(54) SILICON GERMANIUM-ON-INSULATOR FORMATION BY THERMAL MIXING

(71) Applicant: INTERNATIONAL BUSINESS MACHINES CORPORATION, Armonk, NY (US)

(72) Inventors: Stephen W. Bedell, Wappingers Falls, NY (US); Joel P. De Souza, Putnam Valley, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/237,260

(22) Filed: Aug. 15, 2016

(65) Prior Publication Data
US 2016/0359023 A1    Dec. 8, 2016

Related U.S. Application Data

(62) Division of application No. 14/619,326, filed on Feb. 11, 2015, now Pat. No. 9,418,870.
(Continued)

(51) Int. Cl.
*H01L 21/324* (2006.01)
*H01L 21/762* (2006.01)
(Continued)

(52) U.S. Cl.
CPC .... *H01L 29/66795* (2013.01); *H01L 21/0245* (2013.01); *H01L 21/02488* (2013.01); *H01L 21/02502* (2013.01); *H01L 21/02513* (2013.01); *H01L 21/02532* (2013.01); *H01L 21/02592* (2013.01); *H01L 21/228* (2013.01);
*H01L 21/24* (2013.01); *H01L 21/26513* (2013.01); *H01L 21/288* (2013.01); *H01L 21/324* (2013.01);
(Continued)

(58) Field of Classification Search
CPC .................. H01L 21/324; H01L 21/28587
USPC ......................................................... 438/151
See application file for complete search history.

(56) References Cited

U.S. PATENT DOCUMENTS 6,169,005 B1 * 1/2001 Kepler ................ H01L 21/2257
257/E21.151
6,461,945 B1 * 10/2002 Yu ...................... H01L 21/28211
257/E21.133
(Continued)

FOREIGN PATENT DOCUMENTS

WO    2004/109776 A2    12/2004

OTHER PUBLICATIONS

List of IBM Patents or Patent Applications Treated As Related Dated Aug. 15, 2016, 2 Pages.
(Continued)

*Primary Examiner* — Moazzam Hossain
*Assistant Examiner* — Omar F Mojaddedi
(74) *Attorney, Agent, or Firm* — Scully, Scott, Murphy & Presser, P.C.; L. Jeffrey Kelly, Esq.

(57) ABSTRACT

A layer of amorphous silicon is formed on a germanium-on-insulator substrate, or a layer of germanium is formed on a silicon-on-insulator substrate. An anneal is then performed which causes thermal mixing of silicon and germanium atoms within one of the aforementioned structures and subsequent formation of a silicon germanium-on-insulator material.

12 Claims, 10 Drawing Sheets

Related U.S. Application Data

(60) Provisional application No. 61/939,262, filed on Feb. 12, 2014.

(51) Int. Cl.
| | |
|---|---|
| *H01L 29/16* | (2006.01) |
| *H01L 29/66* | (2006.01) |
| *H01L 29/161* | (2006.01) |
| *H01L 29/786* | (2006.01) |
| *H01L 21/02* | (2006.01) |
| *H01L 21/228* | (2006.01) |
| *H01L 21/24* | (2006.01) |
| *H01L 21/288* | (2006.01) |
| *H01L 29/10* | (2006.01) |
| *H01L 29/78* | (2006.01) |
| *H01L 21/265* | (2006.01) |
| *H01L 29/775* | (2006.01) |

(52) U.S. Cl.
CPC .... *H01L 21/7624* (2013.01); *H01L 21/76251* (2013.01); *H01L 21/76283* (2013.01); *H01L 29/1054* (2013.01); *H01L 29/161* (2013.01); *H01L 29/1604* (2013.01); *H01L 29/7842* (2013.01); *H01L 29/78684* (2013.01); *H01L 29/775* (2013.01); *H01L 29/785* (2013.01); *H01L 29/78696* (2013.01)

(56) References Cited

U.S. PATENT DOCUMENTS

| | | | | |
|---|---|---|---|---|
| 6,503,833 B1 * | 1/2003 | Ajmera | ............. | H01L 21/28518 257/E21.165 |
| 2004/0235264 A1 * | 11/2004 | Forbes | ............. | H01L 21/26506 438/429 |
| 2005/0054175 A1 | 3/2005 | Bauer | | |
| 2005/0093100 A1 * | 5/2005 | Chen | ................ | H01L 21/76254 257/616 |
| 2005/0196926 A1 * | 9/2005 | Hanafi | ................ | H01L 29/7842 438/287 |
| 2005/0205934 A1 | 9/2005 | Lochtefeld et al. | | |
| 2006/0042542 A1 * | 3/2006 | Bedell | ................ | H01L 21/76254 117/105 |
| 2006/0057403 A1 * | 3/2006 | Bedell | ..................... | C30B 29/52 428/450 |
| 2006/0073663 A1 * | 4/2006 | Iinuma | ............. | H01L 29/41783 438/300 |
| 2009/0011610 A1 * | 1/2009 | Bojarczuk, Jr. | ... | H01L 21/28079 438/763 |
| 2009/0061604 A1 * | 3/2009 | Nayfeh | ............. | H01L 21/02381 438/493 |
| 2009/0170295 A1 * | 7/2009 | Vincent | ............. | H01L 21/32105 438/507 |
| 2010/0084613 A1 * | 4/2010 | Maxwell | ................ | H01L 21/324 252/500 |
| 2011/0095379 A1 * | 4/2011 | Wong | ................ | H01L 21/28079 257/402 |
| 2011/0163289 A1 * | 7/2011 | Zhu | ................... | H01L 21/28255 257/9 |
| 2012/0164809 A1 * | 6/2012 | Yoon | ................ | H01L 21/26506 438/303 |
| 2012/0313216 A1 * | 12/2012 | Cai | ..................... | H01L 21/8228 257/526 |
| 2012/0326232 A1 * | 12/2012 | Cheng | ............... | H01L 29/66772 257/347 |
| 2014/0284769 A1 * | 9/2014 | Halimaoui | ........ | H01L 21/02694 257/616 |
| 2015/0380408 A1 * | 12/2015 | Hong | .................. | H01L 27/1203 257/391 |

OTHER PUBLICATIONS

Office Action dated Sep. 27, 2017 received in U.S. Appl. No. 15/237,235.

Office Action dated Jan. 10, 2019 received in U.S. Appl. No. 15/237,235, copy not enclosed.

* cited by examiner

US 10,249,737 B2

SILICON GERMANIUM-ON-INSULATOR FORMATION BY THERMAL MIXING

BACKGROUND

The present application relates to semiconductor manufacturing, and more particularly to methods of fabricating a silicon germanium (hereinafter "SiGe")-on-insulator (hereinafter "SGOI") material in which thermal mixing of either a layer of silicon formed on a germanium-on-insulator (hereinafter "GeOI"), or a layer of germanium formed on a silicon-on-insulator (hereinafter "SOI") is employed.

Crystalline $Si_{1-x}Ge_x$ is attractive for both bipolar and metal oxide semiconductor field effect transistor (hereinafter "MOSFET") applications. High performance p-channel MOSFETs consisting of a SiGe channel are in use in 22 nm complementary metal oxide semiconductor (hereinafter "CMOS") devices. Increasing germanium (hereinafter "Ge") concentration in $Si_{1-x}Ge_x$ to very high values, such as x>70% Ge, allows higher carrier mobilities for both electron and holes. However, $Si_{1-x}Ge_x$ epitaxially grown on a single crystal Si substrate is metastable and relaxes by generating misfit dislocations and stacking faults when its thickness exceeds a certain value, known as the critical thickness. This thickness decreases exponentially as x increases in $Si_{1-x}Ge_x$.

Thus, there is a need for providing a method that allows for the formation of high structural quality $Si_{1-x}Ge_x$-on-insulator material, in particular $Si_{1-x}Ge_x$-on-insulator materials that contain x>50%, that avoids the problems associated in the prior art.

SUMMARY

A layer of amorphous silicon is formed on a germanium-on-insulator substrate, or a layer of germanium is formed on a silicon-on-insulator substrate. An anneal is then performed which causes thermal mixing of silicon and germanium atoms within one of the aforementioned structures and subsequent formation of a silicon germanium-on-insulator material.

In one aspect of the present application, various methods of forming a silicon germanium-on-insulator (SGOI) material are provided. In one embodiment of the present application, a method of forming the SGOI material can include providing a structure comprising, from bottom to top, a germanium-on-insulator substrate and an amorphous silicon layer. The structure is then converted into a silicon germanium-on-insulator material by annealing, wherein during the annealing silicon atoms from the amorphous silicon layer intermix with germanium atoms in a germanium layer of the germanium-on-insulator substrate to form a silicon germanium layer.

In another embodiment of the present application, a method of forming the SGOI material may include providing a structure comprising, from bottom to top, a silicon-on-insulator substrate and a germanium layer. The structure is then converted into a silicon germanium-on-insulator material by annealing, wherein during the annealing silicon atoms from a silicon layer of the silicon-on-insulator substrate intermix with germanium atoms in the germanium layer to form a silicon germanium layer.

In another aspect of the present application, methods of forming semiconductor structures are provided. In accordance with one embodiment of the present application, a method of forming the semiconductor structure includes forming a gate structure on an active silicon germanium region of a silicon germanium-on-insulator material. Next, an amorphous silicon layer is formed on exposed surfaces of the active silicon germanium region and surrounding the gate structure. Embedded SiGe source/drain regions are then formed in the active SiGe region and at a footprint of the gate structure utilizing a thermal mixing process in which silicon atoms from the amorphous silicon layer intermix with germanium atoms in the SiGe active region to form the embedded SiGe source/drain regions.

In accordance with another embodiment of the present application, another method of forming a semiconductor structure includes forming an amorphous silicon layer portion on a surface of an active silicon germanium region of a silicon germanium-on-insulator material. A gate structure is then formed on a surface of the amorphous silicon. Next, an embedded SiGe channel region is formed in the active SiGe region and directly beneath the gate structure utilizing a thermal mixing process in which silicon atoms from the amorphous silicon layer portion intermix with germanium atoms in the SiGe active region to form the embedded SiGe channel region.

DETAILED DESCRIPTION

Figure 1:
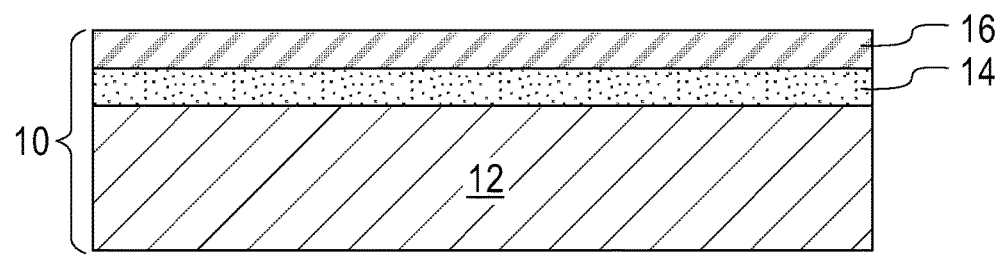
FIG. 1 is a cross sectional view of an exemplary semiconductor structure including a GeOI substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including an GeOI substrate 10 that can be employed in accordance with an embodiment of the present application. The GeOI substrate 10 that can be employed in the present application includes, from bottom to top, a handle substrate 12, an insulator layer 14, and a germanium layer 16. The handle substrate 12 provides mechanical support for the insulator layer 14 and the germanium layer 16.

In one embodiment of the present application, the handle substrate 12 of the GeOI substrate 10 may comprise any semiconductor material. The term "semiconductor" as used throughout the present application denotes a material that has an electrical conductivity value between a conductor, such as copper, and an insulator such as, silicon dioxide. The semiconductor material that may provide the handle substrate 12 of the GeOI substrate 10 includes, for example, doped and undoped Si, doped and undoped Ge or doped and undoped SiGe. Multilayers of these semiconductor materials can also be used as the semiconductor material that provides handle substrate 12. In some embodiments, the handle substrate 12 and the germanium layer 16 are both comprised of germanium. In some embodiments of the present application, the handle substrate 12 is a non-semiconductor material such as, for example, a dielectric material and/or a conductor. In yet other embodiments, the handle substrate 12 may be omitted.

In some embodiments, the handle substrate 12 and the germanium layer 16 may have a same crystal orientation. In other embodiments, the handle substrate 12 and the germanium layer 16 may have different crystal orientations. For example, the crystal orientation of the handle substrate 12 and/or the germanium layer 16 may be {100}, {110}, or {111}. Other crystallographic orientations besides those specifically mentioned can also be used in the present application. The handle substrate 12 and/or the germanium layer 16 of the GeOI substrate 10 may be a single crystalline semiconductor material, a polycrystalline material, or an amorphous material. Typically, at least the germanium layer 16 is a single crystalline semiconductor material.

The insulator layer 14 of the GeOI substrate 10 may be a crystalline or non-crystalline oxide or nitride. In one embodiment, the insulator layer 14 is an oxide such as, for example, silicon dioxide. The germanium layer 16 of the GeOI substrate 10 consists of elemental, i.e., non-alloyed, germanium.

The GeOI substrate 10 may be formed utilizing standard processes including for example, layer transfer. Typically, a layer transfer process is employed in providing the GeOI substrate 10. In such instances, a first semiconductor wafer including at least a layer of germanium is bonded to a second semiconductor wafer that includes the insulator layer 14 and the handle substrate 12. In some embodiments, a bulk germanium substrate may be employed as the first wafer. In other embodiments, the first wafer includes a germanium layer formed by a deposition process such, as for example, epitaxial growth, on a surface of a sacrificial semiconductor substrate. In some embodiments, the sacrificial substrate may include silicon, and a graded SiGe intermediate layer can be formed between the sacrificial substrate and the overlying germanium layer 16. Various material removal processes can be used to remove the sacrificial substrate and the graded SiGe intermediate layer after bonding. When a layer transfer process is employed, an optional thinning step may follow the bonding of the first and second wafers together. The optional thinning step reduces the thickness of the germanium layer 16 to a layer having a thickness that is more desirable.

In one example, the thickness of the germanium layer 16 of the GeOI substrate 10 can be from 10 nm to 200 nm. In another example, the thickness of the germanium layer 16 of the GeOI substrate 10 can be from 50 nm to 70 nm. Other thicknesses that are lesser than or greater than the aforementioned thicknesses ranges may also be employed as the thickness of the germanium layer 16. For example, and when an ETGeOI (extremely thin germanium-on-insulator) substrate is employed, the germanium layer 16 can have a thickness of less than 10 nm. If the thickness of the germanium layer 16 layer is not within a desired range, a thinning step such as, for example, planarization or etching can be used to reduce the thickness of the germanium layer 16 to a value within a desired thickness range. The insulator layer 14 of the GeOI substrate 10 typically has a thickness from 1 nm to 200 nm, with a thickness from 100 nm to 150 nm being more typical. Other thicknesses that are lesser than or greater than the aforementioned thickness ranges can also be employed as the thickness of the insulator layer 14. The thickness of the handle substrate 12 of the GeOI substrate 10 is inconsequential to the present application.

Figure 2:
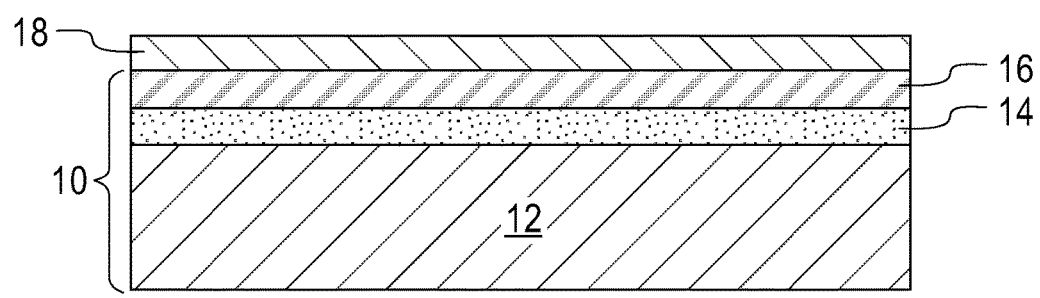
FIG. 2 is a cross sectional view of the exemplary semiconductor structure of FIG. 1 after forming an amorphous Si layer on a topmost surface of the GeOI substrate in accordance with an embodiment of the present application.

Referring now to FIG. 2, there is illustrated the exemplary semiconductor structure of FIG. 1 after forming an amorphous Si layer 18 on a topmost surface of the GeOI substrate 10 in accordance with an embodiment of the present application. As is shown, the amorphous Si layer 18 is a contiguous layer that spans the entirety of the topmost surface of the GeOI substrate 10. As is also shown, the amorphous Si layer 18 is formed on a surface of the germanium layer 16 of the GeOI substrate 10. The term "amorphous Si" is used throughout the present application to denote a non-crystalline allotropic form of silicon.

The amorphous Si layer 18 can be formed utilizing a deposition process including, for example, physical vapor deposition (PVD; also referred to as sputter deposition), chemical vapor deposition (CVD), rapid thermal chemical vapor deposition (RTCVD), plasma enhanced chemical vapor deposition (PECVD), or inductively coupled plasma chemical vapor deposition (ICP CVD). In some embodiments, hydrogen may be introduced during the deposition process forming a hydrogenated amorphous Si layer. The amorphous Si layer 18 can have a thickness from 10 nm to 200 nm. Other thickness that are lesser than or greater than the aforementioned thickness range can also be employed as the thickness of the amorphous Si layer 18.

Figure 3:
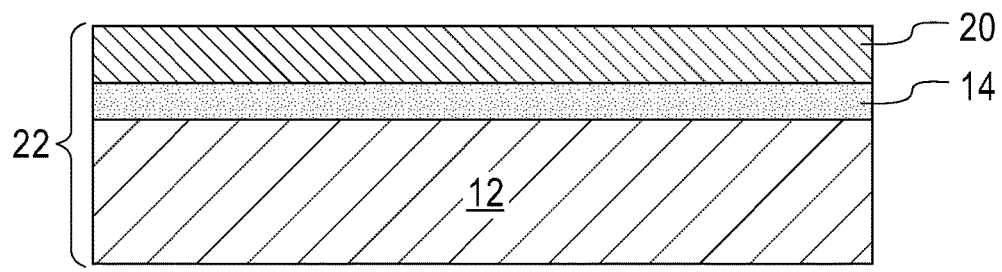
FIG. 3 is a cross sectional view of the exemplary semiconductor structure of FIG. 2 after performing a thermal mixing process in accordance with an embodiment of the present application.

Referring now to FIG. 3, there is illustrated the exemplary semiconductor structure of FIG. 2 after performing a thermal mixing process in accordance with an embodiment of the present application. During thermal mixing, the amorphous Si layer 18 and the underlying germanium layer 16 are converted into a silicon germanium layer 20. Notably, and during thermal mixing, silicon atoms from the amorphous silicon layer 18 diffuse and intermix with germanium atoms in the germanium layer 16 of the germanium-on-insulator substrate GeOI to form silicon germanium layer 20. Thus, a silicon germanium-on-insulator (i.e., SGOI) material 22 including, from bottom to top, the handle substrate 12, the insulator layer 14 and the silicon germanium layer 20, is formed. Typically, and as shown, the amorphous Si layer 18 and the germanium layer 16 are completely consumed during the thermal mixing process. In some embodiments, a portion of the amorphous Si layer 18 may remain and can be removed by utilizing a chemical removal process.

In accordance with the present application, thermal mixing is performed in this embodiment of the present application by annealing in an inert ambient. Examples of inert ambients that can be used during the anneal include helium (He), argon (Ar), neon (Ne), nitrogen ($N_2$) or any mixtures thereof. In one embodiment, the anneal is performed in $N_2$. A single anneal may be performed or multiple anneals (in the same or different inert ambient) may be performed. In one embodiment of the present application, the anneal may be performed at a temperature from 600° C. to 900° C. In some embodiments, the anneal may be performed at a constant rate. In other embodiments, the anneal may be performed a different, variable rates. In yet other embodiments, the anneal may be performed utilizing a series of ramp up cycles and soak cycles, as desired.

In some embodiments, the anneal may be performed in a same reactor chamber (i.e., in-situ) as used to deposit the amorphous Si layer 18. In other embodiments, the anneal may be performed in a different reactor chamber (i.e., ex-situ) from that used to deposit the amorphous Si layer 18.

The resultant silicon germanium layer 20 that forms may have a germanium content from 5 atomic percent germanium to 90 atomic percent germanium. In one embodiment of the present application, the silicon germanium layer 20 that forms may have a germanium content of greater than 50 atomic percent germanium to 90 atomic percent germanium. The germanium content within the silicon germanium layer 20 can be controlled in the present application by the thickness of the amorphous Si layer 18, and/or the thickness of the germanium layer 16 and/or the conditions of the anneal used to perform the thermal mixing. For example, the thicker the amorphous Si layer 18 and/or the thinner the germanium layer 16, the lower the germanium content is within the silicon germanium layer 20 that is formed. The amorphous Si layer 18 also aides in preventing oxidation of the germanium layer 16 during the anneal. In the present application, X-ray, Raman, SIMS, and TEM were used to verify Si diffusion, and conversion of the GeOI substrate 10 into the SGOI substrate 22.

Figure 4:
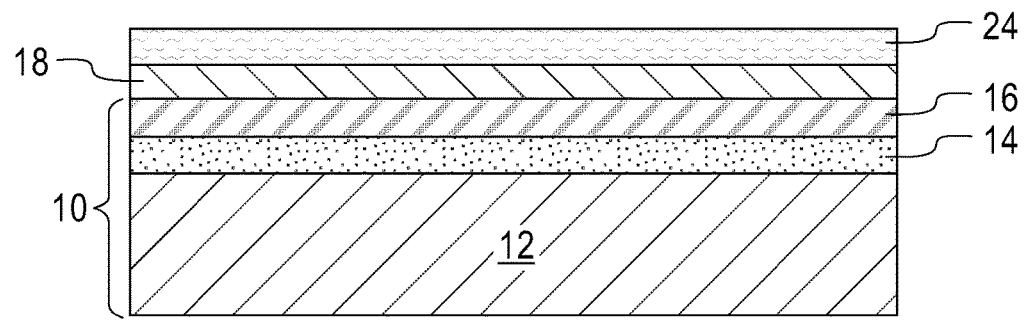
FIG. 4 is a cross sectional view of the exemplary semiconductor structure of FIG. 2 after forming a dielectric material on the amorphous Si layer in accordance with an embodiment of the present application.

Referring now to FIG. 4, there is illustrated the exemplary semiconductor structure of FIG. 2 after forming a dielectric material 24 on the amorphous Si layer 18 in accordance with an embodiment of the present application. The dielectric material 24 is a contiguous dielectric that spans the entirety of the amorphous Si layer 18. The dielectric material 24 includes any insulator material including, for example, silicon dioxide, silicon nitride and/or silicon oxynitride. Other examples of insulators that can be employed as the dielectric material 24 include for example, a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered dielectric structure comprising different dielectric materials, e.g., silicon dioxide, and a dielectric metal oxide, can be formed and used as the dielectric material 24.

In some embodiments of the present application, the dielectric material 24 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the dielectric material 24 can be formed by a thermal growth technique such as, for example, thermal oxidation and/or thermal nitridation. In yet a further embodiment of the present application, a combination of a deposition and thermal growth may be used in forming a multi-layered dielectric material 24 structure.

In one embodiment of the present application, the dielectric material 24 can have a thickness in a range from 10 nm to 100 nm. Other thicknesses that are lesser than or greater than the aforementioned thickness range can also be employed for the thickness of the dielectric material 24.

Figure 5:
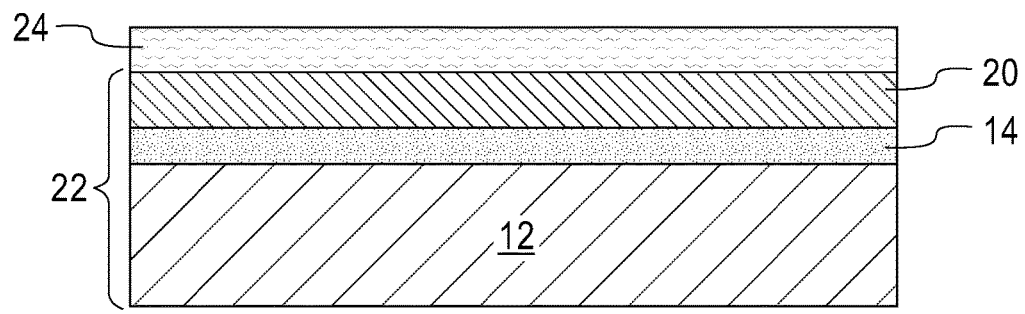
FIG. 5 is a cross sectional view of the exemplary semiconductor structure of FIG. 4 after performing a thermal mixing process in accordance with an embodiment of the present application.

Referring now to FIG. 5, there is illustrated the exemplary semiconductor structure of FIG. 4 after performing a thermal mixing process in accordance with an embodiment of the present application. The thermal mixing that is employed in this embodiment of the present application is an anneal as described in the previous embodiment of the present application; the anneal ambient and conditions described above are applicable here for this embodiment of the present application as well.

The thermal mixing converts the GeOI substrate 10 into a silicon germanium-on-insulator (i.e., SGOI) material 22 including, from bottom to top, the handle substrate 12, the insulator layer 14 and the silicon germanium layer 20. Typically, and as shown, the amorphous Si layer 18 and the germanium layer 16 are completely consumed during the thermal mixing process. The dielectric material 24 remains and is present atop the silicon germanium layer 20 of the SGOI material 22. In some embodiments, a portion of the amorphous Si layer 18 can remain between the dielectric material 24 and the now formed silicon germanium layer 20.

Figure 6:
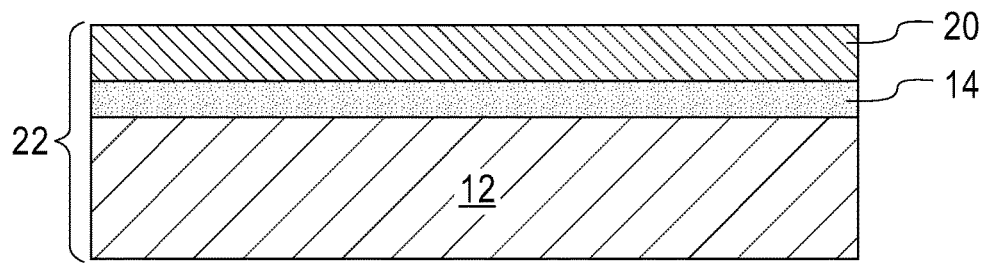
FIG. 6 is a cross sectional view of the exemplary semiconductor structure of FIG. 5 after removing the dielectric material from the structure in accordance with an embodiment of the present application.

Referring now to FIG. 6, there is illustrated the exemplary semiconductor structure of FIG. 5 after removing the dielectric material 24 from the structure (i.e., the SGOI material 22) in accordance with an embodiment of the present application. In some embodiments (not shown), the entirety of the dielectric material 24 may remain atop the SGOI material 22. In other embodiments, portions of the dielectric material 24 may be removed to provide either a dielectric material having a reduced thickness as compared to the originally deposited dielectric material 24, or patterned dielectric material portions.

In one embodiment of the present application, the dielectric material 24 can be entirely or partially removed utilizing chemical mechanical planarization, grinding and/or chemical etching. In cases in which patterned dielectric material portions are formed, lithography and etching can be used to pattern the dielectric material 24.

Figure 7:
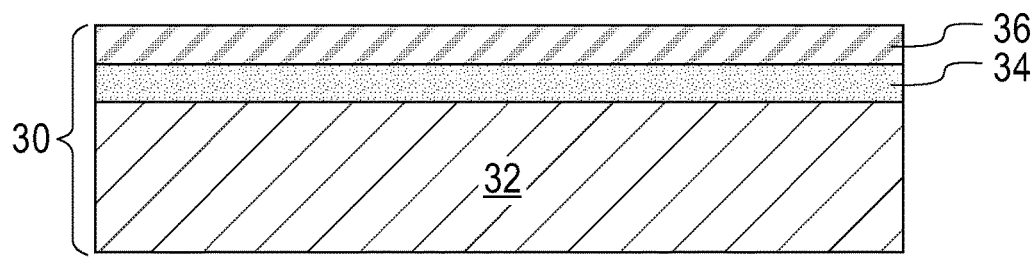
FIG. 7 is a cross sectional view of an exemplary semiconductor structure including an SOI substrate that can be employed in accordance with an embodiment of the present application.

Referring now to FIG. 7, there is illustrated an exemplary semiconductor structure including an SOI substrate 30 that can be employed in accordance with an embodiment of the present application. The SOI substrate 30 that can be employed in the present application includes, from bottom to top, a handle substrate 32, an insulator layer 34, and a silicon layer 36. The handle substrate 32 provides mechanical support for the insulator layer 34 and the silicon layer 36.

The handle substrate 32 of the SOI substrate 30 may comprise one of the semiconductor materials mentioned above for handle substrate 12. In some embodiments, the handle substrate 32 and the silicon layer 36 are both comprised of silicon. In some embodiments of the present application, the handle substrate 32 is a non-semiconductor material such as, for example, a dielectric material and/or a conductor. In yet other embodiments, the handle substrate 32 may be omitted.

In some embodiments, the handle substrate 32 and the silicon layer 36 may have a same crystal orientation. In other embodiments, the handle substrate 32 and the silicon layer 36 may have different crystal orientations. For example, the crystal orientation of the handle substrate 32 and/or the silicon layer 36 may be {100}, {110}, or {111}. Other crystallographic orientations besides those specifically mentioned can also be used in the present application. The handle substrate 32 and/or the silicon layer 36 of the SOI substrate 30 may be a single crystalline semiconductor material, a polycrystalline material, or an amorphous material. Typically, at least the silicon layer 36 is a single crystalline semiconductor material.

The insulator layer 34 of the SOI substrate 30 may be a crystalline or non-crystalline oxide or nitride. In one embodiment, the insulator layer 34 is an oxide such as, for example, silicon dioxide. The silicon layer 36 of the SOI substrate 30 consists of elemental, i.e., non-alloyed, silicon.

The SOI substrate 30 may be formed utilizing standard processes including for example, layer transfer. Typically, a layer transfer process is employed in providing the SOI substrate 30. In such instances, a first semiconductor wafer including at least a layer of silicon is bonded to a second semiconductor wafer that includes the insulator layer 34 and the handle substrate 32. In some embodiments, a bulk silicon substrate may be employed as the first wafer. In other embodiments, the first wafer includes a silicon layer formed by a deposition process such, as for example, epitaxial growth, on a surface of a sacrificial semiconductor substrate. In some embodiments, the sacrificial substrate may include silicon, and a graded SiGe intermediate layer can be formed between the sacrificial substrate and the overlying silicon layer 36. The sacrificial substrate and the graded SiGe intermediate layer can be removed after bonding. When a layer transfer process is employed, an optional thinning step may follow the bonding of the first and second wafers together. The optional thinning step reduces the thickness of the silicon layer 36 to a layer having a thickness that is more desirable.

In one example, the thickness of the silicon layer 36 of the SOI substrate 30 can be from 10 nm to 100 nm. In another example, the thickness of the silicon layer 36 of the SOI substrate 30 can be from 50 nm to 70 nm. Other thicknesses that are lesser than or greater than the aforementioned thicknesses ranges may also be employed in the present application. For example, and when an ETSOI (extremely thin silicon-on-insulator) substrate is employed, the silicon layer 36 can have a thickness of less than 10 nm. If the thickness of the silicon layer 36 layer is not within a desired range, a thinning step such as, for example, planarization or etching can be used to reduce the thickness of the silicon layer 36 to a value within a desired thickness range. The insulator layer 34 of the SOI substrate 30 typically has a thickness from 1 nm to 200 nm, with a thickness from 100 nm to 150 nm being more typical. Other thicknesses that are lesser than or greater than the aforementioned thickness ranges can also be employed as the thickness of the insulator layer 34. The thickness of the handle substrate 32 of the SOI substrate 30 is inconsequential to the present application.

Figure 8:
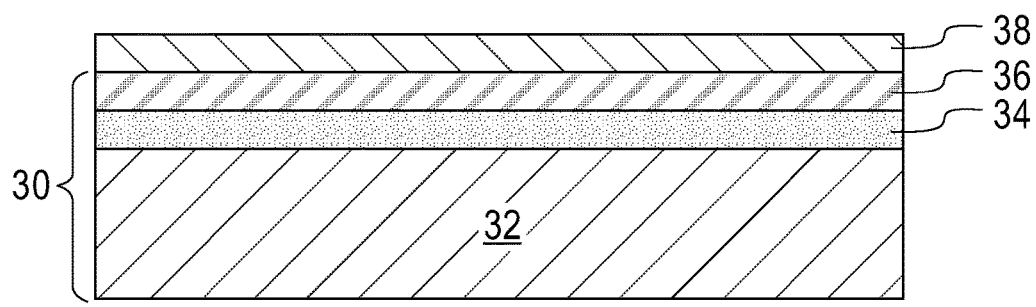
FIG. 8 is a cross sectional view of the exemplary semiconductor structure of FIG. 7 after forming a germanium (Ge) layer on a topmost surface of the SOI substrate in accordance with an embodiment of the present application.

Referring now to FIG. 8, there is illustrated the exemplary semiconductor structure of FIG. 7 after forming a germanium (Ge) layer 38 on a topmost surface of the SOI substrate 30 in accordance with an embodiment of the present application. As is shown, the Ge layer 38 is a contiguous layer that spans the entirety of the topmost surface of the SOI substrate 30. As is also shown, the Ge layer 38 is formed on a surface of the silicon layer 36 of the SOI substrate 30.

The Ge layer 38 can be formed utilizing a deposition process including, for example, epitaxial growth. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on {100} orientation. Thus, and in the present embodiment, the Ge layer 38 has an epitaxial relationship, i.e., same crystal orientation, as that of the surface of the Si layer 36.

Examples of various epitaxial growth process that are suitable for use in forming the Ge layer 38 of the present application include, e.g., rapid pressure chemical vapor deposition (RPCVD), low-energy plasma deposition (LEPD), ultra-high vacuum chemical vapor deposition (UHVCVD), atmospheric pressure chemical vapor deposition (APCVD) or molecular beam epitaxy (MBE). The temperature for epitaxial deposition process for forming the Ge layer 38 typically ranges from 550° C. to 900° C. Although higher temperature typically results in faster deposition, the faster deposition may result in crystal defects and film cracking.

A number of different germanium source gases which are well known to those skilled in the art may be used for the deposition of the Ge layer 38. Carrier gases like hydrogen, nitrogen, helium and argon can be used during the epitaxial growth process. In some embodiments, hydrogen may be introduced during the deposition process forming a hydrogenated Ge layer. The Ge layer 38 can have a thickness from 10 nm to 200 nm. Other thickness that are lesser than or greater than the aforementioned thickness range can also be employed as the thickness of the Ge layer 38.

Figure 9:
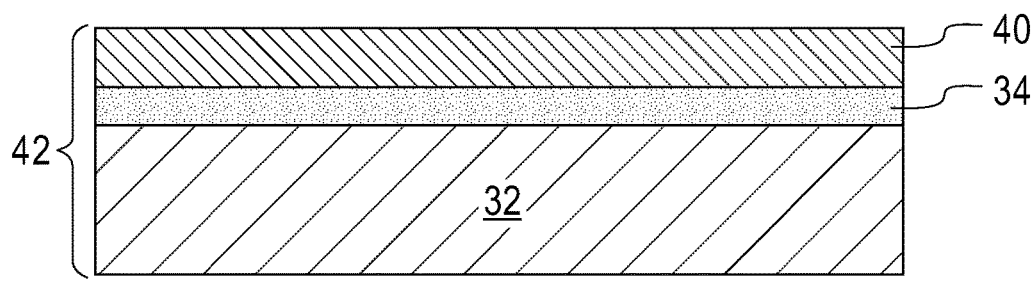
FIG. 9 is a cross sectional view of the exemplary semiconductor structure of FIG. 8 after performing a thermal mixing process in accordance with an embodiment of the present application.

Referring now to FIG. 9, there is illustrated the exemplary semiconductor structure of FIG. 8 after performing a thermal mixing process in accordance with an embodiment of the present application. During thermal mixing, the Ge layer 38 and the underlying Si layer 36 are converted into a silicon germanium layer 40; intermixing occurs at the interface between the Ge layer 38 and the Si layer 38. Notably, and during thermal mixing, silicon atoms from the Si layer 36 diffuse and intermix with germanium atoms in the Ge layer 38 to form silicon germanium layer 40. Thus, a silicon germanium-on-insulator (i.e., SGOI) material 42 including, from bottom to top, the handle substrate 32, the insulator layer 34 and the silicon germanium layer 42, is formed. Typically, and as shown, the Si layer 36 and the Ge layer 38 are completely consumed during the thermal mixing process. In some embodiments, a portion of the Ge layer 38 can remain atop the now formed silicon germanium layer 42. In such an embodiment, any remaining Ge layer 38 can be removed utilizing chemical mechanical planarization, grinding and/or chemical (wet or dry) etching. In some embodiments, the remaining Ge layer 38 can be left atop the now formed silicon germanium layer 42.

In accordance with the present application, thermal mixing is performed in this embodiment of the present application by annealing in hydrogen ($H_2$). In some embodiments, the hydrogen may be admixed with an inert ambient such as, for example, helium (He), argon (Ar), neon (Ne), nitrogen ($N_2$) or any mixtures thereof; in such an embodiment the hydrogen is present in a concentration up to 10 vol. %, the remainder up to 100 vol. % being one of the inert ambients mentioned above. In one embodiment, the anneal is performed in $H_2$ only. A single anneal may be performed or multiple anneals (in the same or different $H_2$ ambient) may be performed. In one embodiment of the present application, the anneal may be performed at a temperature from 600° C. to 900° C. In some embodiments, the anneal may be performed at a constant rate. In other embodiments, the anneal may be performed a different, variable rates. In yet other embodiments, the anneal may be performed utilizing a series of ramp up cycles and soak cycles, as desired.

In some embodiments, the anneal may be performed in a same reactor chamber (i.e., in-situ) as used to deposit the Ge layer 38. In other embodiments, the anneal may be performed in a different reactor chamber (i.e., ex-situ) from that used to deposit the Ge layer 38.

The resultant silicon germanium layer 40 that forms may have a germanium content from 5 atomic percent germanium to 90 atomic percent germanium. In one embodiment of the present application, the silicon germanium layer 40 that forms may have a germanium content of greater than 50 atomic percent germanium to 90 atomic percent germanium. The germanium content within the silicon germanium layer 40 can be controlled in the present application by the thickness of the Si layer 36, and/or the thickness of the Ge layer 38 and/or the conditions of the anneal used to perform the thermal mixing. For example, the thicker the Si layer 36 and/or the thinner the Ge layer 38, the lower the germanium content is within the silicon germanium layer 40 that is formed. In the present application, X-ray, Raman, SIMS, and TEM were used to verify Si diffusion, and conversion of the SOI substrate 30 into the SGOI substrate 42.

Figure 10:
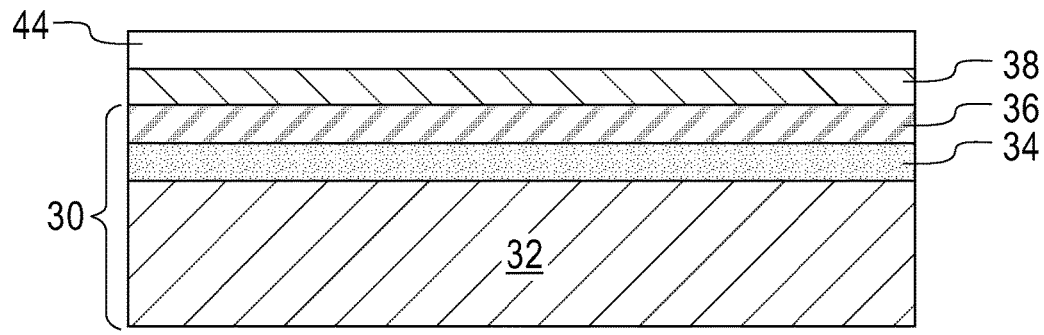
FIG. 10 is a cross sectional view of the exemplary semiconductor structure of FIG. 8 after forming a dielectric material on the Ge layer in accordance with an embodiment of the present application.

Referring now to FIG. 10, there is illustrated the exemplary semiconductor structure of FIG. 8 after forming a dielectric material 44 on the Ge layer 38 in accordance with an embodiment of the present application. The dielectric material 44 that is employed in this embodiment of the present application may include one of the insulators mentioned above for dielectric material 24. Also, the dielectric material 44 may be formed by, and have a thickness within a range, as mentioned above for dielectric material 24.

Figure 11:
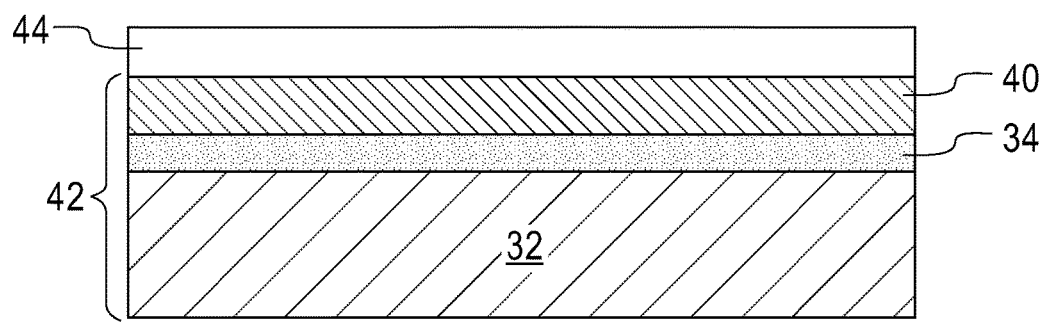
FIG. 11 is a cross sectional view of the exemplary semiconductor structure of FIG. 10 after performing a thermal mixing process in accordance with an embodiment of the present application.

Referring now to FIG. 11, there is illustrated the exemplary semiconductor structure of FIG. 10 after performing a thermal mixing process in accordance with an embodiment of the present application. The thermal mixing process used in this embodiment of the present application is the same as that described above in providing the structure shown in FIG. 9; the anneal ambient and conditions described above in regard to providing the structure shown in FIG. 9 are applicable here for this embodiment of the present application as well.

The thermal mixing converts the SOI substrate 30 and the Ge layer 38 into a silicon germanium-on-insulator (i.e., SGOI) material 42 including, from bottom to top, the handle substrate 32, the insulator layer 34 and the silicon germanium layer 40. Typically, and as shown, the Si layer 36 and the Ge layer 38 are completely consumed during the thermal mixing process. In some embodiments, a remaining portion of the Ge layer 38 (not shown) may be located between the dielectric material 44 and the silicon germanium layer 40. The dielectric material 44 remains and is present atop the silicon germanium layer 40 of the SGOI material 42.

Figure 12:
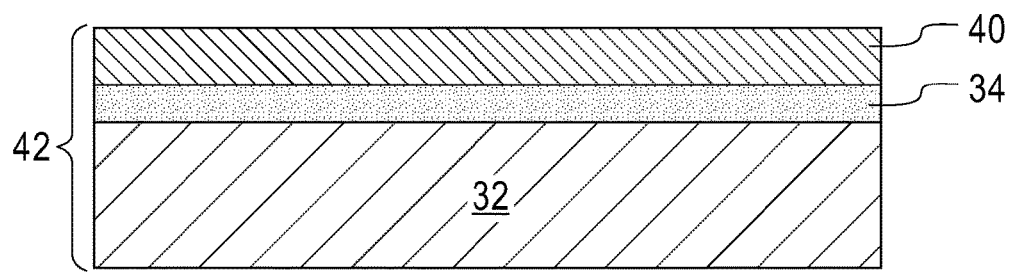
FIG. 12 is a cross sectional view of the exemplary semiconductor structure of FIG. 11 after removing the dielectric material from the structure in accordance with an embodiment of the present application.

Referring now to FIG. 12, there is illustrated the exemplary semiconductor structure of FIG. 11 after removing the dielectric material 44 from the structure in accordance with an embodiment of the present application. The dielectric material 44 can be removed utilizing chemical mechanical planarization, grinding and/or chemical etching. In embodiments in which a remaining portion of Ge layer 38 is present, the remaining portion of Ge layer 38 can be removed utilizing chemical mechanical planarization, grinding and/or chemical etching.

Figure 13:
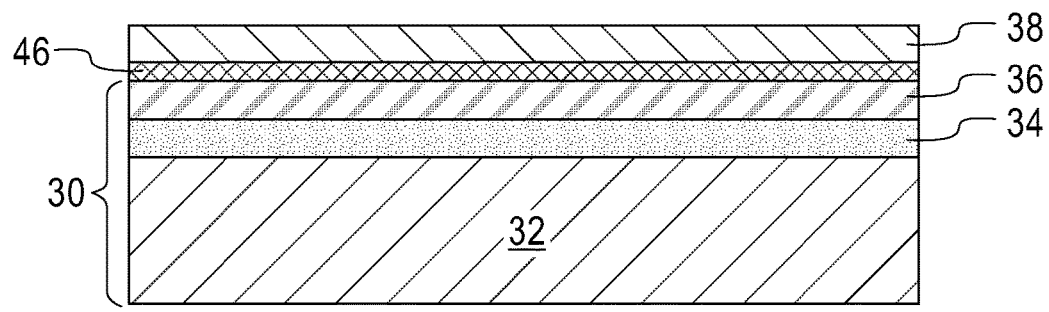
FIG. 13 is a cross sectional view of the exemplary semiconductor structure of FIG. 8 after forming an amorphous region at an interface between the Ge layer and a silicon layer of the SOI substrate in accordance with an embodiment of the present application.

Referring now to FIG. 13, there is illustrated the exemplary semiconductor structure of FIG. 8 after forming an amorphous region 46 at an interface between the Ge layer 38 and the SOI substrate 30 (i.e., the Si layer 36) in accordance with an embodiment of the present application. In the embodiment that is illustrated, the amorphous region 46 is continuously present between the Ge layer 38 and the Si layer 36.

The amorphous region 46 is a region that lacks any well defined crystal structure. Moreover, the amorphous region 46 is a region in which crystal damage has been introduced into the structure by utilizing one or more amorphization ion implantation processes. The one or more amorphization ion implantation processes includes ion implanting an amorphizing ion into the structure. The amorphizing ion that can be employed in the present application in providing the amorphous region 46 includes any ion such as Si or Ge. The one or more amorphization ion implantation processes may be performed at room temperature (i.e., from 20° C. to 40° C.), or temperatures below room temperature may be employed. The conditions for the one or more amorphization ion implantation process are selected to form the amorphous region 44 at the interface between the Si layer 36 and the Ge layer 38.

Figure 14:
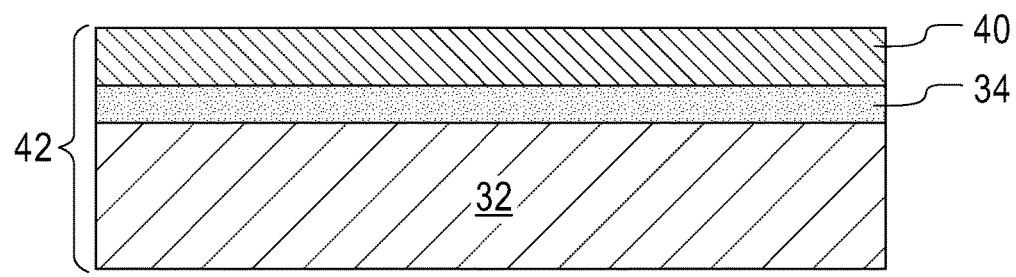
FIG. 14 is a cross sectional view of the exemplary semiconductor structure of FIG. 13 after performing a thermal mixing process in accordance with an embodiment of the present application.

Referring now to FIG. 14, there is illustrated the exemplary semiconductor structure of FIG. 13 after performing a thermal mixing process in accordance with an embodiment of the present application. The thermal mixing process used in this embodiment of the present application is the same as that described above in providing the structure shown in FIG. 9; the anneal ambient and conditions described above in regard to providing the structure shown in FIG. 9 are applicable here for this embodiment of the present application as well.

The thermal mixing converts the SOI substrate 30 and the Ge layer 38 into a silicon germanium-on-insulator (i.e., SGOI) material 42 including, from bottom to top, the handle substrate 32, the insulator layer 34 and a silicon germanium layer 40. Typically, and as shown, the Si layer 36 and the Ge layer 38 are completely consumed during the thermal mixing process. In some embodiments, a remaining portion of the Ge layer 38 (not shown) may be located atop the silicon germanium layer 40. During the thermal mixing process, the amorphous region 46 is recrystallized.

Figure 15:
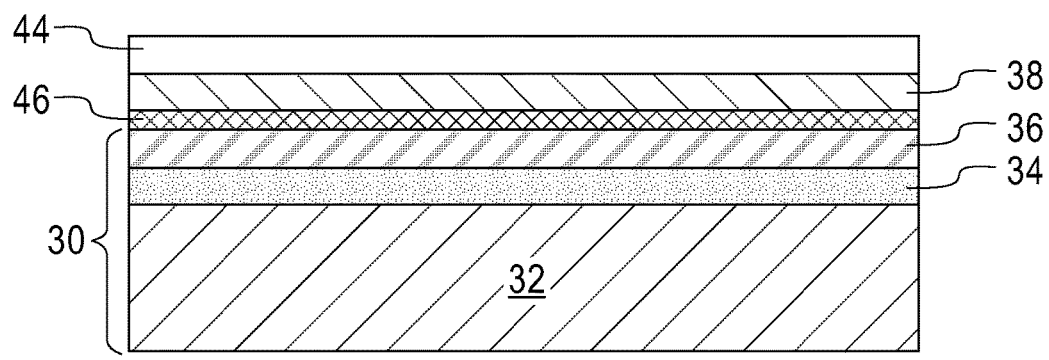
FIG. 15 is a cross sectional view of the exemplary semiconductor structure of FIG. 13 after forming a dielectric material on the Ge layer in accordance with an embodiment of the present application.

Referring now to FIG. 15, there is shown the exemplary semiconductor structure of FIG. 13 after forming a dielectric material 44 on the Ge layer 38 in accordance with an embodiment of the present application. The dielectric material 44 that is employed in this embodiment of the present application may include one of the insulators mentioned above for dielectric material 24. Also, the dielectric material 44 may be formed by, and have a thickness within a range, as mentioned above for dielectric material 24.

Figure 16:
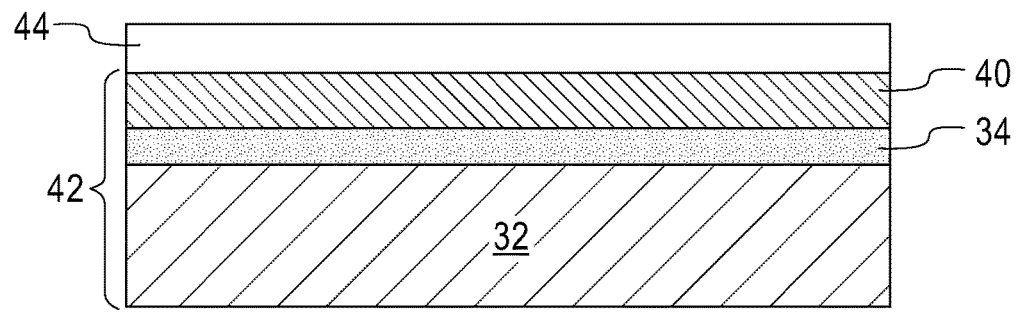
FIG. 16 is a cross sectional view of the exemplary semiconductor structure of FIG. 15 after performing a thermal mixing process in accordance with an embodiment of the present application.

Referring now to FIG. 16, there is illustrated the exemplary semiconductor structure of FIG. 16 after performing a thermal mixing process in accordance with an embodiment of the present application. The thermal mixing process used in this embodiment of the present application is the same as that described above in providing the structure shown in FIG. 9; the anneal ambient and conditions described above in regard to providing the structure shown in FIG. 9 are applicable here for this embodiment of the present application as well.

The thermal mixing converts the SOI substrate 30 and the Ge layer 38 into a silicon germanium-on-insulator (i.e., SGOI) material 42 including, from bottom to top, the handle substrate 32, the insulator layer 34 and the silicon germanium layer 40. Typically, and as shown, the Si layer 36 and the Ge layer 38 are completely consumed during the thermal mixing process. In some embodiments, a remaining portion of the Ge layer 38 (not shown) may be located between the dielectric material 44 and the silicon germanium layer 40. The dielectric material 44 remains and is present atop the silicon germanium layer 40 of the SGOI material 42. During the thermal mixing process, the amorphous region 46 is recrystallized.

Figure 17:
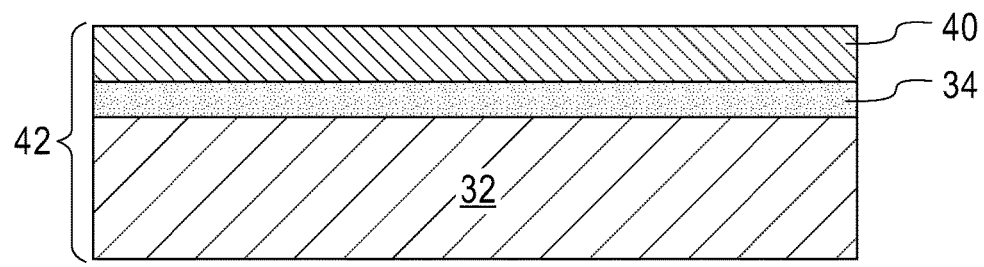
FIG. 17 is a cross sectional view of the exemplary semiconductor structure of FIG. 16 after removing the dielectric material from the structure in accordance with an embodiment of the present application.

Referring now to FIG. 17, there is illustrated the exemplary semiconductor structure of FIG. 16 after removing the dielectric material 44 from the structure in accordance with an embodiment of the present application. The dielectric material 44 can be removed utilizing chemical mechanical planarization, grinding and/or chemical etching. In embodiments in which a remaining portion of Ge layer 38 is present, the remaining portion of Ge layer 38 can be removed utilizing chemical mechanical planarization, grinding and/or chemical etching.

Figure 18:
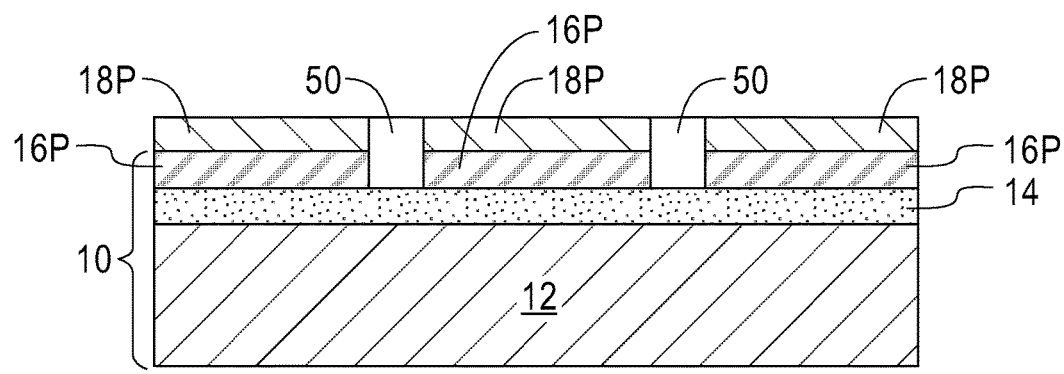
FIG. 18 is a cross sectional view of the exemplary semiconductor structure of FIG. 2 after forming dielectric structures within the amorphous Si layer and the Ge layer of the GeOI substrate in accordance with an embodiment of the present application.

Referring now to FIG. 18, there is illustrated the exemplary semiconductor structure of FIG. 1 after forming dielectric structures 50 within the amorphous Si layer 18 and the Ge layer 16 of the GeOI substrate 10 in accordance with an embodiment of the present application. In the drawing, the remaining portions of the amorphous Si layer 18 are labeled as 18P and can be referred to hereinafter as amorphous Si portions 18P. In the drawing, the remaining portions of the Ge layer 16 are labeled as 16P and can be referred to hereinafter as germanium portions 16P.

The number of dielectric structures 50 that can be formed is not limited to two as shown in FIG. 18. Instead, a single dielectric structure 50 can be formed, or greater than two dielectric structures 50 can be formed. Each dielectric structure 50 that is formed has a bottommost surface in contact with a topmost surface of the insulator layer 14. Each dielectric structure 50 that is formed has sidewall surfaces that contact sidewall surfaces of an abutting germanium portion 16P and an abutting amorphous Si portion 18P. Each dielectric structure 50 can have a topmost surface that is coplanar with a topmost surface of the amorphous Si portions 18P. In some embodiments, the topmost surface of each dielectric structure 50 may extend above or below the topmost surface of the amorphous Si portions 18P.

Each dielectric structure 50 can be formed by first forming a trench through the amorphous Si layer 18 and through the Ge layer 16, stopping on a topmost surface of the insulator layer 14. The trench can be formed by lithography and anisotropic etching. A single etch or multiple etching steps may be used in providing the trench. Once the trench is formed, the trench is filled with a trench dielectric material such as, for example, silicon dioxide. A planarization process may follow the trench dielectric fill.

Figure 19:
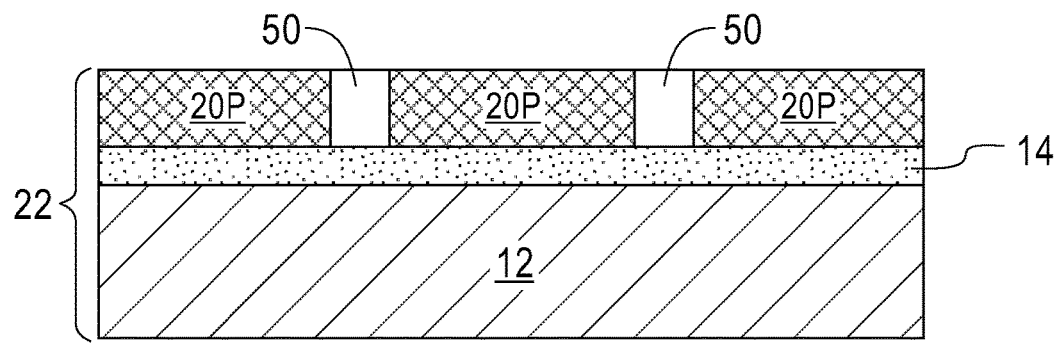
FIG. 19 is a cross sectional view of the exemplary semiconductor structure of FIG. 18 after performing a thermal mixing process in accordance with an embodiment of the present application.

Referring now to FIG. 19, there is illustrated the exemplary semiconductor structure of FIG. 18 after performing a thermal mixing process in accordance with an embodiment of the present application. During thermal mixing, the amorphous Si portions 18P and the underlying germanium portions 16P are converted into a silicon germanium portions 20P. Notably, and during thermal mixing silicon atoms from the amorphous silicon portions 18P diffuse and intermix with germanium atoms in the germanium portions 16P of the germanium-on-insulator substrate GeOI to form silicon germanium portions 20P. Thus, a silicon germanium-on-insulator (i.e., SGOI) material 22 including, from bottom to top, the handle substrate 12, the insulator layer 14 and silicon germanium portions 20P, is formed. Typically, and as shown, the amorphous Si portions 18P and the germanium portions 16P are completely consumed during the thermal mixing process. In some embodiments, an upper portion of the amorphous Si portion 18P can remain and be removed during a subsequently performed material removal process. As is also shown, each silicon germanium portion 20P is isolated from its nearest neighboring silicon germanium portion 20P by a dielectric structure 50.

In accordance with the present application, thermal mixing is performed in this embodiment of the present application by annealing utilizing the conditions and ambient mentioned above in providing the structure shown in FIG. 3 of the present application. Each silicon germanium portion 20P that is formed is similar to the silicon germanium layer 20 formed in FIG. 3. In some embodiments, and following the thermal mixing process, a planarization process can be performed to provide the planar structure shown in FIG. 19. In some embodiments (not shown), the topmost surface of each dielectric structure 50 may extend above the topmost surface of each silicon germanium portion 20P.

Although not shown, it is possible to form a dielectric material across the structure shown in FIG. 18 prior to performing the thermal mixing process. The dielectric material can be removed after the thermal mixing is performed as also described hereinabove.

Figure 20:
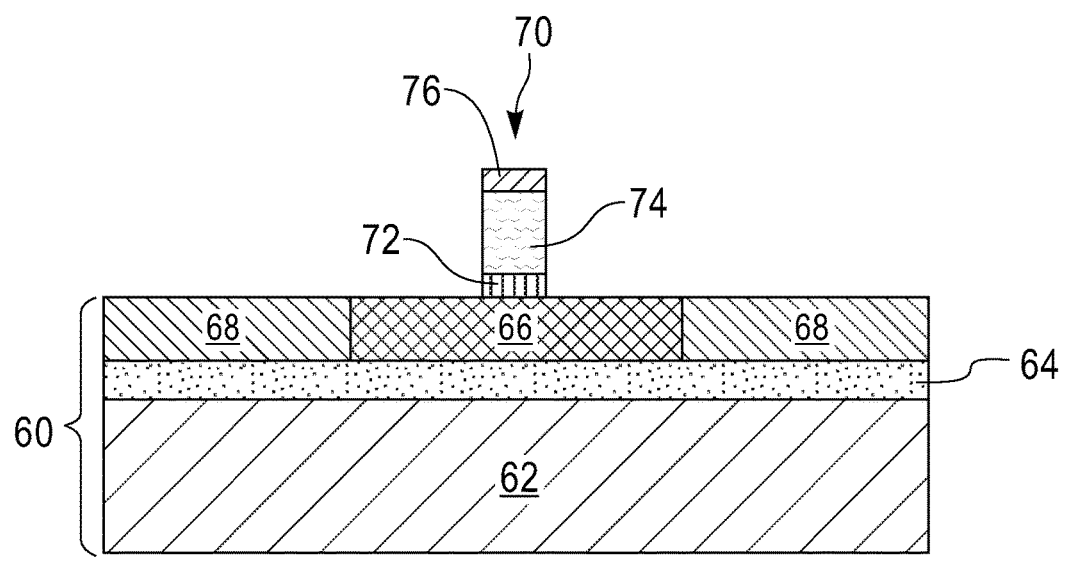
FIG. 20 is a cross sectional view of an exemplary semiconductor structure including a gate structure located on an active silicon germanium (SiGe) region of an SGOI substrate in accordance with an embodiment of the present application.

Referring now to FIG. 20, there is illustrated an exemplary semiconductor structure including, a gate structure 70 located on an active SiGe region 66 of a SGOI substrate 60 in accordance with an embodiment of the present application. In addition to the active SiGe region 66, the SGOI substrate 60 also includes a handle substrate 62 and an insulator layer 64. Handle substrate 62 includes one of the materials mentioned above for handle substrate 12. Insulator layer 64 includes one of the insulator materials mentioned above for insulator layer 14. In the present embodiments, active SiGe region 66 includes a patterned silicon germanium layer. In some embodiments, the active SiGe region 66 may comprise a non-patterned silicon germanium layer. Although a single active SiGe region 66 is described and illustrated, a plurality of active SiGe regions can be present atop the insulator layer 64.

The silicon germanium layer that provides the active silicon germanium region 66 can be formed utilizing any of the various embodiments of the present application including the one described in FIGS. 18 and 19 of the present application. Element 68 represents dielectric structures. In some embodiments, the dielectric structures 68 are formed prior to formation of the silicon germanium layer that provides the active silicon region 66 (as shown, for example, in FIGS. 18 and 19 above). In other embodiments, the silicon germanium layer that provides the active silicon germanium region 66 is formed first, and then the dielectric structures are formed by forming a trench (by lithography and etching) and filling the trench with a trench dielectric material.

In some embodiments (not shown), the active silicon germanium region 66 can be processed into a fin structure or a nanowire structure utilizing processes techniques well known to those skilled in the art. When a fin structure or nanowire structure is formed, the subsequently formed gate structure would straddle the fin structure or the nanowire structure.

In some embodiments of the present application, the gate structure 70 can be a functional gate structure. By "functional gate structure" it is meant a permanent gate structure used to control output current (i.e., flow of carriers in the channel of a semiconductor device through electrical or magnetic fields. In other embodiments, the gate structure 70 can be a sacrificial gate structure. By "sacrificial gate structure" it is meant a material or materials that serves (or serve) as a placeholder structure for a functional gate structure to be subsequently formed.

In embodiments in which the gate structure 70 is a functional gate structure, the gate structure includes, from bottom to top, a gate dielectric portion 72, a gate conductor portion 70, and a gate cap portion 76. In some embodiments, the gate cap portion 76 may be omitted.

The gate dielectric portion 72 includes a gate dielectric material. In one embodiment, the gate dielectric material that provides the gate dielectric portion 72 may be a semiconductor oxide, a semiconductor nitride, and/or a semiconductor oxynitride. In one example, the gate dielectric material that can be used in providing the gate dielectric portion 72 can be composed of silicon dioxide, silicon nitride and/or silicon oxynitride. In another embodiment of the present application, the gate dielectric material that can be used in providing the gate dielectric portion 72 may include at least a dielectric metal oxide. Exemplary dielectric metal oxides that can be used as the gate dielectric material that provides gate dielectric portion 72 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides the gate dielectric portion 72.

In some embodiments of the present application, the gate dielectric material that provides the gate dielectric portion 72 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides the gate dielectric portion 72 can be formed by a thermal growth technique such as, for example, thermal oxidation and/or thermal nitridation. In yet a further embodiment of the present application, a combination of a deposition and thermal growth may be used in forming a multilayered gate dielectric structure that provides the gate dielectric portion 72.

In one embodiment of the present application, the gate dielectric material that provides the gate dielectric portion 72 can have a thickness in a range from 1 nm to 10 nm. Other thicknesses that are lesser than or greater than the aforementioned thickness range can also be employed for the gate dielectric material that provides the gate dielectric portion 72.

The gate conductor portion 74 includes a gate conductor material. In one embodiment of the present application, the gate conductor material that provides the gate conductor portion 74 can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor material that provides the gate conductor portion 74 is comprised of a doped polysilicon or doped polysilicon germanium. In another embodiment, a lower portion of the gate conductor material that provides the gate conductor portion 74 is comprised a conductive material other than doped polysilicon or doped polysilicon germanium, and an upper portion of the gate conductor material that provides the gate conductor portion 74 is comprised of doped polysilicon or doped silicon germanium.

The gate conductor material that provides the gate conductor portion 74 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor material that provides the gate conductor portion 74 has a thickness from 1 nm to 100 nm. Other thicknesses that are lesser than or greater than the aforementioned thickness range can also be employed for the gate conductor material that provides the gate conductor portion 74.

In some embodiments, and as shown, a gate cap portion 76 is present on the gate conductor portion 74. The gate cap portion 76 may be composed of any dielectric hard mask material such as, for example, silicon dioxide, silicon nitride, and/or silicon oxynitride. The dielectric hard mask material that provides the gate cap portion 76 may be formed by a deposition process such as, for example, CVD and PECVD. In one embodiment, the dielectric hard mask material that provides the gate cap portion 76 has a thickness from 1 nm to 100 nm. Other thicknesses that are lesser than or greater than the aforementioned thickness range can also be employed for the dielectric hard mask material that provides the gate cap portion 76.

Gate structure 70 is formed by first forming a gate material stack of, from bottom to top, the gate dielectric material, the gate conductor material and, if present, the hard mask dielectric material. The gate material stack is then patterned by lithography and etching which provides the gate structure 70. Lithography can include forming a photoresist (not shown) on the topmost surface of the material stack, exposing the photoresist to a desired pattern of radiation, and then developing the exposed photoresist with a resist developer to provide a patterned photoresist atop the gate material stack. At least one etch is then employed which transfers the pattern from the patterned photoresist into the various materials of the gate material stack. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the gate material stack, the patterned photoresist can be removed utilizing a resist stripping process such as, for example, ashing.

As is shown in the embodiment illustrated in FIG. 20, the sidewall edges of the gate dielectric portion 72, the gate conductor portion, and the dielectric cap portion 76 are vertically coincident to (i.e., vertically aligned with) each other.

In some embodiments of the present application (not shown), and as mentioned above, gate structure 70 can be a sacrificial gate structure. In such an embodiment, the sacrificial gate structure may include, from bottom to top, a sacrificial gate dielectric, a sacrificial gate material, and a sacrificial gate cap. The sacrificial gate dielectric and/or the sacrificial gate cap are optional. When present, the sacrificial gate dielectric may include one of the dielectric materials mentioned above for providing the gate dielectric portion 72. When present, the sacrificial gate cap may include one of the dielectric hard mask materials used in providing the gate gap portion 76. The sacrificial gate material may be composed of polysilicon or a metal such as Al, W, or Cu. Blanket sacrificial material layers are first formed, and then lithography and etching are used in providing a sacrificial gate structure. In such an embodiment, the sacrificial gate structure is replaced with a permanent gate structure (as defined above) anytime after source/drain regions are formed.

Figure 21:
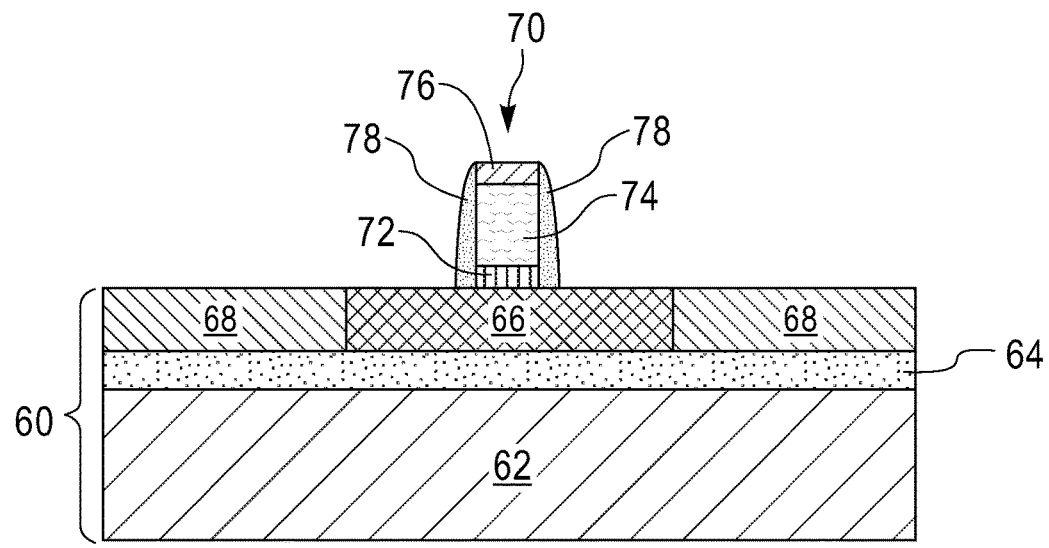
FIG. 21 is a cross sectional view of the exemplary semiconductor structure of FIG. 20 after formation of a gate dielectric spacer.

Referring now to FIG. 21, there is illustrated the exemplary semiconductor structure of FIG. 20 after formation of a gate dielectric spacer 78. The gate dielectric spacer 78 is formed on exposed sidewall surfaces of the gate structure 70. A base of the gate dielectric spacer 78 may be present on a topmost surface of the active silicon germanium region 66. The gate dielectric spacer 78 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the gate dielectric spacer 78 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

Figure 22:
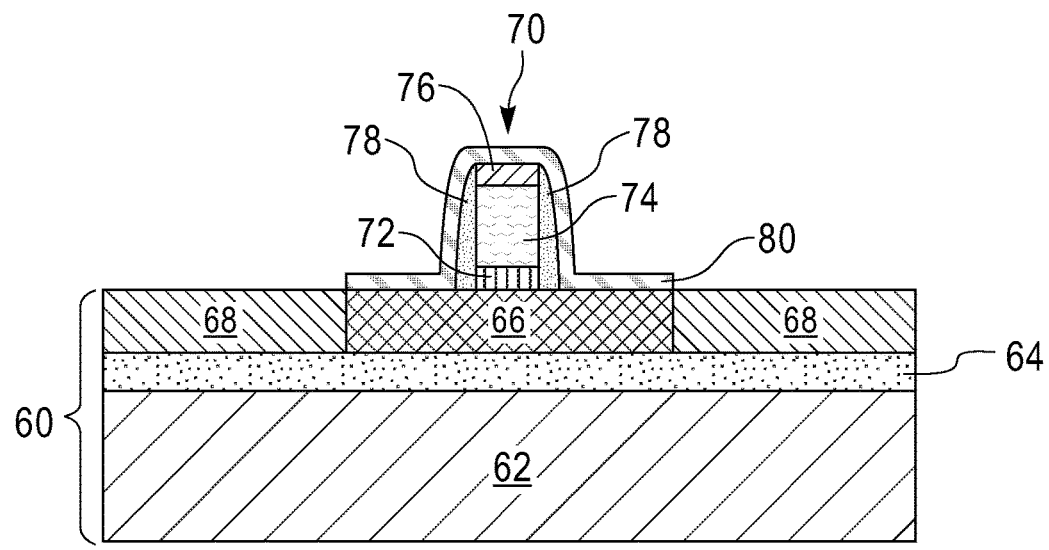
FIG. 22 is a cross sectional view of the exemplary semiconductor structure of FIG. 21 after forming an amorphous Si layer.

Referring now to FIG. 22, there is illustrated the exemplary semiconductor structure of FIG. 21 after forming an amorphous Si layer 80. Amorphous Si layer 80 is present on exposed surfaces of the active silicon germanium region 66 and surrounds the gate dielectric spacer 78 and the gate structure 70. The amorphous Si layer 80 can be formed utilizing one of the deposition processing mentioned above for forming amorphous Si layer 18. Amorphous Si layer 80 may or may not be hydrogenated. The amorphous Si layer 80 can have a thickness with the range mentioned above for amorphous Si layer 18.

Figure 23:
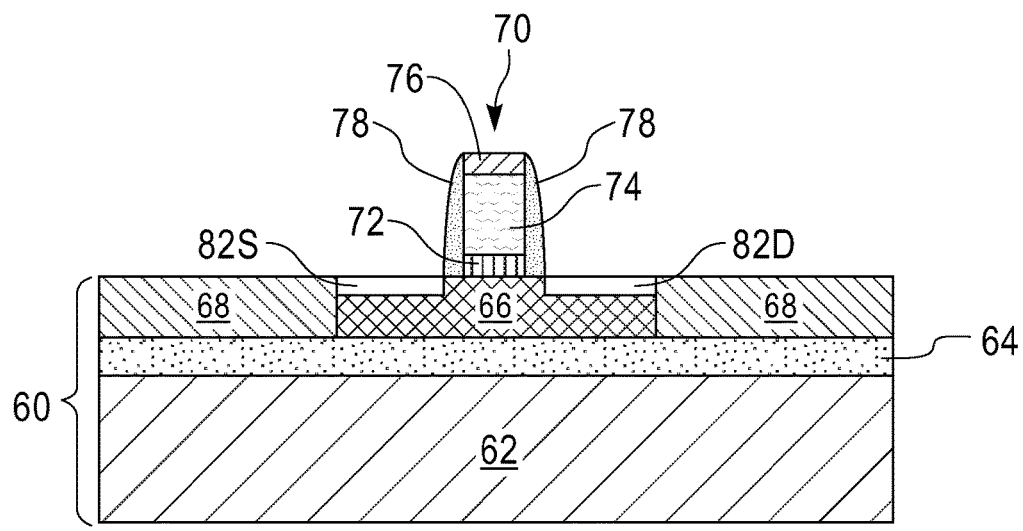
FIG. 23 is a cross sectional view of the exemplary semiconductor structure of FIG. 22 after forming embedded SiGe source/drain regions in the active SiGe region and at a footprint of the gate structure utilizing a thermal mixing process in accordance with an embodiment of the present application.

Referring now to FIG. 23, there is illustrated the exemplary semiconductor structure of FIG. 22 after forming embedded SiGe source/drain regions 82S, 82D in the active SiGe region 66 and at a footprint of the gate structure 70 utilizing a thermal mixing process in accordance with an embodiment of the present application. During thermal mixing, Si atoms from the amorphous Si layer 80 diffuse into the active silicon germanium region 66 and mix with the Si and Ge atoms within the active silicon germanium region 66 to provide the embedded SiGe source/drain regions 82S, 82D. The embedded SiGe source/drain regions 82S, 82D that are formed by this process have a lower germanium content than the remaining portion of the active silicon germanium region 66, especially the channel region that is located directly beneath the gate structure 70. Such a structure will yield smaller lattice parameter source/drain regions and will thus create tensile strain in the channel. In cases in which the active silicon germanium region contains a germanium content of greater than 85 atomic percent, this process can result in the ability to fabricate high mobility MOSFETs.

In accordance with the present application, thermal mixing is performed in this embodiment of the present application by annealing utilizing the conditions and ambient mentioned above in providing the structure shown in FIG. 3 of the present application. The amorphous Si layer 80 can be completely consumed by this process. In some embodiments, a portion of the amorphous Si layer 80 may remain and be removed during a subsequently performed material removal process.

Although not shown, it is possible to form a dielectric material atop the amorphous Si layer 80 prior to performing the thermal mixing process. The dielectric material can be removed after the thermal mixing is performed as also described hereinabove.

Figure 24:
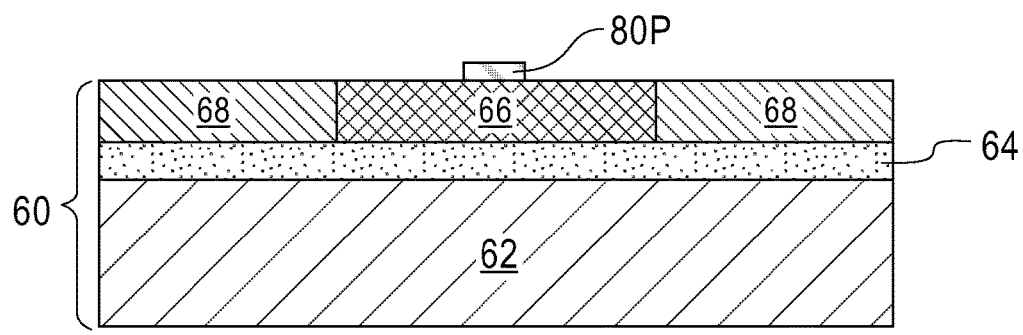
FIG. 24 is a cross sectional view of an exemplary semiconductor structure including an amorphous Si layer portion on an active SiGe region of an SGOI substrate in accordance with an embodiment of the present application.

Referring now to FIG. 24, there is illustrated an exemplary semiconductor structure including, an amorphous Si layer portion 80P on an active SiGe region 66 of a SGOI substrate 60 in accordance with an embodiment of the present application. In some embodiments, the amorphous Si layer portion 80P spans across the entire length of the active SiGe region 66. In addition to the active SiGe region 66, the SGOI substrate 60 also includes a handle substrate 62 and an insulator layer 64. Handle substrate 62 includes one of the materials mentioned above for handle substrate 12. Insulator layer 64 includes one of the insulator materials mentioned above for insulator layer 14. In the present embodiments, active SiGe region 66 includes a patterned silicon germanium layer. In some embodiments, the active SiGe region 66 may comprise a non-patterned silicon germanium layer. Although a single active SiGe region 66 is described and illustrated, a plurality of active SiGe regions can be present atop the insulator layer 64.

The silicon germanium layer that provides the active silicon germanium region 66 can be formed utilizing any of the various embodiments of the present application including the one described in FIGS. 18 and 19 of the present application. Element 68 represents dielectric structures. In some embodiments, the dielectric structures 68 are formed prior to formation of the silicon germanium layer that provides the active silicon germanium region 66 (as shown, for example, in FIGS. 18 and 19 above). In other embodiments, the silicon germanium layer that provides the active silicon germanium region 66 is formed first, and then the dielectric structures are formed by forming a trench (by lithography and etching) and filling the trench with a trench dielectric material.

In some embodiments (not shown), the active silicon germanium region 66 can be processed into a fin structure or a nanowire structure utilizing processes techniques well known to those skilled in the art. When a fin structure or nanowire structure is formed, the subsequently formed gate structure would straddle the fin structure or the nanowire structure.

The amorphous Si portion 80P can be formed utilizing one of the deposition processing mentioned above for forming amorphous Si layer 18. Amorphous Si portion 80P may or may not be hydrogenated. The amorphous Si portion 80P can have a thickness with the range mentioned above for amorphous Si layer 18.

Figure 25:
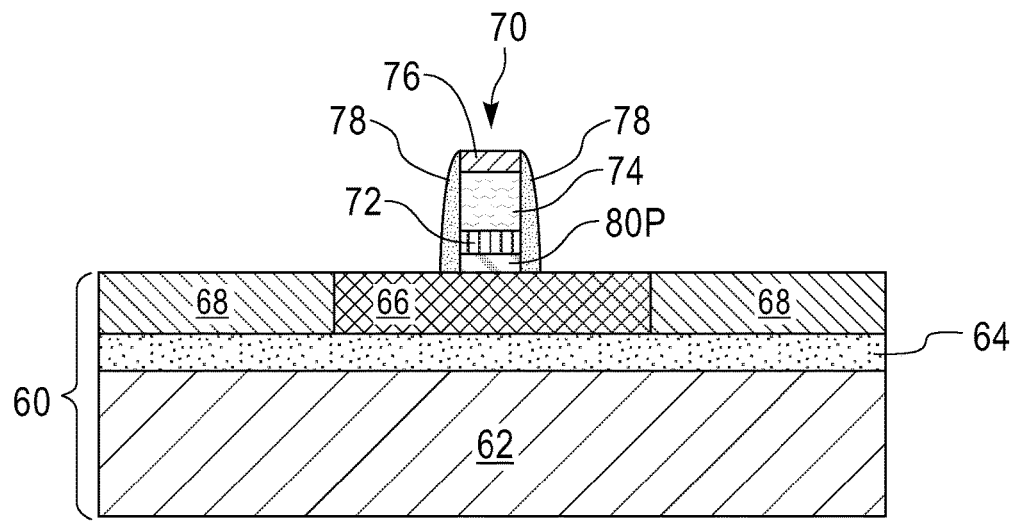
FIG. 25 is a cross sectional view of the exemplary semiconductor structure of FIG. 24 after formation of a gate structure on the amorphous Si layer portion and formation of a gate dielectric spacer.

Referring now to FIG. 25, there is illustrated the exemplary semiconductor structure of FIG. 24 after formation of a gate structure 70 on the amorphous Si layer portion 80P and formation of a gate dielectric spacer 78. In one embodiment, the gate structure 70 may be a functional gate structure, as defined above, and thus includes from bottom to top, gate dielectric portion 72, gate conductor portion 74 and gate cap portion 76. In another embodiment (not shown), gate structure 70 is a sacrificial gate structure which is replaced with a functional gate structure after subsequent formation of an embedded SiGe channel region in the active SiGe region 66. The gate dielectric spacer 78 used in this embodiment of the present applicant is the same as the gate dielectric spacer used in providing the structure shown in FIG. 21 of the present application.

Figure 26:
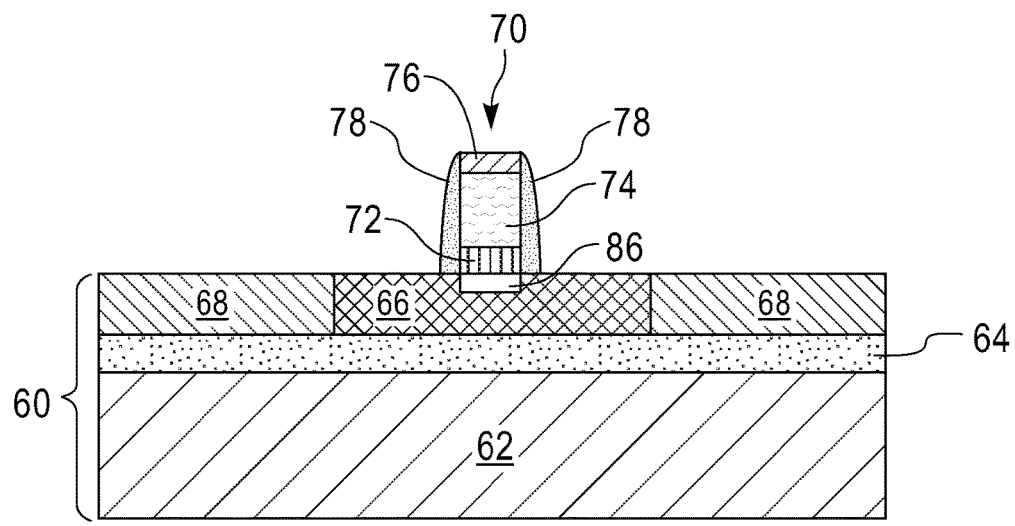
FIG. 26 is a cross sectional view of the exemplary semiconductor structure of FIG. 25 after forming an embedded SiGe channel region in the active SiGe region and directly beneath the gate structure utilizing a thermal mixing process in accordance with an embodiment of the present application.

Referring now to FIG. 26, there is illustrated the exemplary semiconductor structure of FIG. 25 after forming embedded SiGe channel region 86 in the active SiGe region 66 and directly beneath the gate structure 70 utilizing a thermal mixing process in accordance with an embodiment of the present application.

In accordance with the present application, thermal mixing is performed in this embodiment of the present application by annealing utilizing the conditions and ambient mentioned above in providing the structure shown in FIG. 3 of the present application. The amorphous Si portion 80P can be completely consumed by this process.

In accordance with this embodiment of the present application, embedded SiGe channel region 86 has a lower germanium content than that in the source/drain regions (to be subsequently formed and not shown herein). Such a structure will yield a smaller lattice parameter in the channel region and will thus experience compressive strain in the channel due to the higher germanium content surrounding the embedded SiGe channel region 86. This structure will result in a high mobility MOSFET.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A method of forming a semiconductor structure, said method comprising:
   forming an amorphous silicon layer portion directly on a topmost surface of an active silicon germanium (SiGe) region of a silicon germanium-on-insulator material;

forming a gate structure on a topmost surface of said amorphous silicon layer portion, wherein said gate structure comprises a gate dielectric portion present directly on the topmost surface of said amorphous silicon layer portion and a gate conductor portion present on said dielectric portion;

forming a gate dielectric spacer on sidewalls of said gate structure and sidewalls of said amorphous silicon layer portion, wherein a bottommost surface of said gate dielectric spacer is in direct contact with said topmost surface of said active SiGe region and is coplanar with a bottommost surface of said amorphous silicon layer portion; and forming an embedded SiGe channel region in said active SiGe region directly beneath said gate structure utilizing a thermal mixing process in which silicon atoms from said amorphous silicon layer portion intermix with germanium atoms in said SiGe active region to form said embedded SiGe channel region, wherein said thermal mixing process entirely removes the amorphous silicon layer from the semiconductor structure such that a topmost surface of said embedded SiGe channel region is in direct physical contact with a bottommost surface of said gate dielectric portion and said embedded SiGe channel region has a lower germanium content than said active SiGe region.

2. The method of claim 1, wherein said amorphous silicon layer portion is present on a portion of said active silicon germanium region.

3. The method of claim 1, wherein said amorphous silicon layer portion comprises hydrogenated amorphous silicon.

4. The method of claim 1, wherein said active silicon germanium region is a fin structure or a nanowire structure.

5. The method of claim 1, wherein a dielectric structure is located on each side of the active silicon germanium region.

6. The method of claim 1, wherein said gate structure has sidewalls that are vertically aligned to sidewalls of said amorphous silicon layer portion.

7. The method of claim 1, wherein said gate structure is a sacrificial gate structure, and said sacrificial gate structure is replaced with a functional gate structure after forming said embedded SiGe channel region.

8. The method of claim 1, wherein said gate structure is a functional gate structure, and wherein said gate dielectric material portion of said functional gate structure has a bottommost surface that directly contacts a topmost surface of said amorphous silicon layer prior to said forming said embedded SiGe channel region.

9. The method of claim 1, wherein sidewalls of said embedded SiGe channel region are vertically aligned with sidewalls of said gate structure.

10. The method of claim 1, wherein said embedded SiGe channel region is compressively strained.

11. The method of claim 1, wherein said silicon germanium-on-insulator material is formed by a process comprising:

providing a structure comprising, from bottom to top, a germanium-on-insulator substrate and an amorphous silicon layer, wherein said germanium-on-insulator substrate comprises a germanium layer in direct contact with an insulator; and converting said structure into a silicon germanium-on-insulator material by annealing, wherein during said annealing silicon atoms from said amorphous silicon layer intermix with germanium atoms in a germanium layer of said germanium-on-insulator substrate to form a silicon germanium layer.

12. The method of claim 1, wherein said silicon germanium-on-insulator material is formed by a process comprising:

providing a structure comprising, from bottom to top, a silicon-on-insulator substrate and a germanium silicon layer; and converting said structure into a silicon germanium-on-insulator material by annealing, wherein during said annealing silicon atoms from a silicon layer of the silicon-on-insulator substrate with germanium atoms in said germanium layer to form a silicon germanium layer directly on an insulator of said silicon-on-insulator substrate.

* * * * *